US009020768B2

(12) United States Patent
Arntson et al.

(10) Patent No.: US 9,020,768 B2
(45) Date of Patent: Apr. 28, 2015

(54) TWO-WIRE PROCESS CONTROL LOOP CURRENT DIAGNOSTICS

(75) Inventors: Douglas W. Arntson, Maple Grove, MN (US); Jason H. Rud, Mayer, MN (US)

(73) Assignee: Rosemount Inc., Eden Prairie, MN (US)

( * ) Notice: Subject to any disclaimer, the term of this patent is extended or adjusted under 35 U.S.C. 154(b) by 656 days.

(21) Appl. No.: 13/210,662

(22) Filed: Aug. 16, 2011

(65) Prior Publication Data

US 2013/0046490 A1 Feb. 21, 2013

(51) Int. Cl.

*G01R 31/00* (2006.01)
*G05B 15/02* (2006.01)
*G05B 23/02* (2006.01)
*G08C 25/00* (2006.01)

(52) U.S. Cl.

CPC .................................... *G08C 25/00* (2013.01)

(58) Field of Classification Search

USPC .......... 702/58, 33–35, 47, 51, 53, 57, 64–65, 702/81, 84, 108, 113–114, 116, 127, 130, 702/133, 138, 182–183, 185, 188–189; 73/1.16, 1.35, 1.57, 1.59; 700/6, 9–10, 700/79–80, 108–109, 174, 177; 307/24, 31, 307/82; 340/3.1, 3.42–3.44; 341/108, 110, 341/116–117, 126, 131, 142, 144, 155

See application file for complete search history.

(56) References Cited

U.S. PATENT DOCUMENTS 4,783,659 A * 11/1988 Frick .......................... 340/870.37
4,804,958 A 2/1989 Longsdorf .............. 340/870.07
5,036,886 A 8/1991 Olsen et al. ............. 137/625.65
5,416,409 A 5/1995 Hunter ....................... 324/158.1
5,481,200 A 1/1996 Voegele et al. ............... 324/718
5,573,032 A 11/1996 Lenz et al. .................... 137/486
5,682,476 A 10/1997 Tapperson et al. ........ 395/200.05
5,956,663 A 9/1999 Eryurek ........................ 702/183
5,970,430 A 10/1999 Burns et al. .................. 702/122
6,006,338 A 12/1999 Longsdorf et al.
6,014,612 A 1/2000 Larson et al. ................ 702/183
6,026,352 A 2/2000 Burns et al. .................. 702/182
6,176,247 B1 1/2001 Winchcomb et al. ........... 137/14
6,182,019 B1 * 1/2001 Wiklund ....................... 702/100
6,186,167 B1 2/2001 Grumstrup et al. ........ 137/487.5
6,445,963 B1 9/2002 Blevins et al. .................. 700/44
6,512,358 B2 1/2003 Klofer et al. ............. 340/870.39

(Continued)

FOREIGN PATENT DOCUMENTS

DE 42 09 785 A1 9/1993
DE 298 24 256 U1 7/2001

(Continued)

OTHER PUBLICATIONS

International Search Report and Written Opinion for PCT Application No. PCT/US2012/049269, dated Oct. 22, 2012, 11 pages.

(Continued)

*Primary Examiner* — Toan Le

(74) *Attorney, Agent, or Firm* — Westman, Champlin & Koehler, P.A.

(57) ABSTRACT

A process variable transmitter controls a signal on a communication loop. A diagnostic component on the transmitter compares an expected signal level on the communication loop with an actual value to detect on-scale errors.

18 Claims, 8 Drawing Sheets

(56) References Cited

U.S. PATENT DOCUMENTS

| | | | | |
|---|---|---|---|---|
| 6,631,882 | B2 | 10/2003 | Mack | 251/129.04 |
| 7,089,086 | B2 | 8/2006 | Schoonover | 700/275 |
| 7,098,798 | B2 | 8/2006 | Huisenga et al. | 340/635 |
| 7,280,048 | B2 | 10/2007 | Longsdorf et al. | 340/664 |
| 7,321,846 | B1 | 1/2008 | Huisenga et al. | 702/183 |
| 7,590,511 | B2 | 9/2009 | Huisenga et al. | 702/183 |
| 7,630,861 | B2 | 12/2009 | Longsdorf et al. | 702/183 |
| 7,680,460 | B2 | 3/2010 | Nelson et al. | 455/67.11 |
| 2002/0082799 | A1 | 6/2002 | Pramanik | 702/130 |
| 2002/0121910 | A1 | 9/2002 | Rome et al. | 324/718 |
| 2003/0062494 | A1 | 4/2003 | Snowbarger et al. | 251/89 |
| 2005/0030185 | A1 * | 2/2005 | Huisenga et al. | 340/635 |
| 2005/0149295 | A1 | 7/2005 | Pfundlin et al. | 702/189 |
| 2005/0168343 | A1 | 8/2005 | Longsdorf et al. | |

FOREIGN PATENT DOCUMENTS

| | | | |
|---|---|---|---|
| EP | 1 396 771 | A1 | 3/2004 |
| WO | WO 98/29785 | | 7/1998 |
| WO | WO 00/79352 | A2 | 12/2000 |
| WO | WO 03/040657 | A2 | 5/2003 |
| WO | WO 03/040851 | A2 | 5/2003 |
| WO | WO 03/060851 | A1 | 7/2003 |
| WO | 2005/017851 | A1 | 2/2005 |

OTHER PUBLICATIONS

"Improving Safety Instrumented System Reliability"; *FIELDVUE® Instruments*; Emerson Process Management; Feb. 2002; 8 pages.

International Search Report and Written Opinion for PCT Application No. PCT/US2004/037289, dated Dec. 22, 2005, 14 pages.

International Search Report and Written Opinion for PCT Application No. PCT/US2004/025289, dated Nov. 5, 2004, 12 pages.

"Safety Networks—Increase Productivity, Reduce Work-Related Accidents and Save Money" Online 2003; ODVA Networks Built on a Common Industrial Protocol; XP002353502, http://www.can-cia.org/devicenet/CIPWh; 8 pages.

Copy of application for US U.S. Appl. No. 10/719,163, filed Nov. 21, 2003, 44 pp.

"Functional Safety and Safety Integrity Levels"; Bently Nevada; *Application Note*; Apr. 2002, pp. 1-6.

International Search Report and Written Opinion for PCT Application No. PCT/US2006/009604, dated Sep. 26, 2012, 10 pages.

Application for U.S. Appl. No. 10/829,124, filed Apr. 21, 2004, 41 pages.

Application for U.S. Appl. No. 10/733,558, filed Dec. 11, 2003, 34 pages.

Application for U.S. Appl. No. 10/866,930, filed Jun. 14, 2004, 47 pages.

Application for U.S. Appl. No. 10/955,790, filed Sep. 30, 2004, 34 pages.

"Safety Field$^{IT}$ 2600T Pressure Transmitter Family"; *ABB Instrumentaion Spa* 02-02-02; 28 pages.

"Computer" from Wikipedia, the free encyclopedia; http://en.wikipedia.org/wiki/Camputer; dated Sep. 29, 2006; 12 pages.

Application for U.S. Appl. No. 10/635,944, filed Aug. 2, 2003, 31 pages.

EP Communication from EP 12751650.8, dated Apr. 15, 2014.

Office Action Chinese Patent Application No. 201210063769.9, dated Jul. 23, 2014.

* cited by examiner

TWO-WIRE PROCESS CONTROL LOOP CURRENT DIAGNOSTICS

BACKGROUND

The present disclosure relates to process variable transmitters used in process control and monitoring systems. More specifically, the present disclosure relates to performing loop current diagnostics to identify on-scale errors in the loop current of a transmitter.

Process variable transmitters are used to measure process parameters (or process variables) in a process control or monitoring system. Microprocessor-based transmitters often include a sensor, an analog-to-digital converter for converting an output from the sensor into a digital form, a microprocessor for compensating the digitized output, and an output circuit for transmitting a compensated output. Currently, this transmission is normally done over a process control loop, such as a 4-20 milliamp control loop, or wirelessly.

Typically, in a 4-20 milliamp process instrument, the control loop is controlled by a loop current regulator. A loop current regulator regulates the loop current to reflect process variables sensed by the sensors in the instrument.

SUMMARY

A process variable transmitter controls a signal on a communication loop. A diagnostic component on the transmitter compares an expected signal level on the communication loop with an actual value to detect on-scale errors.

DETAILED DESCRIPTION

Figure 1:
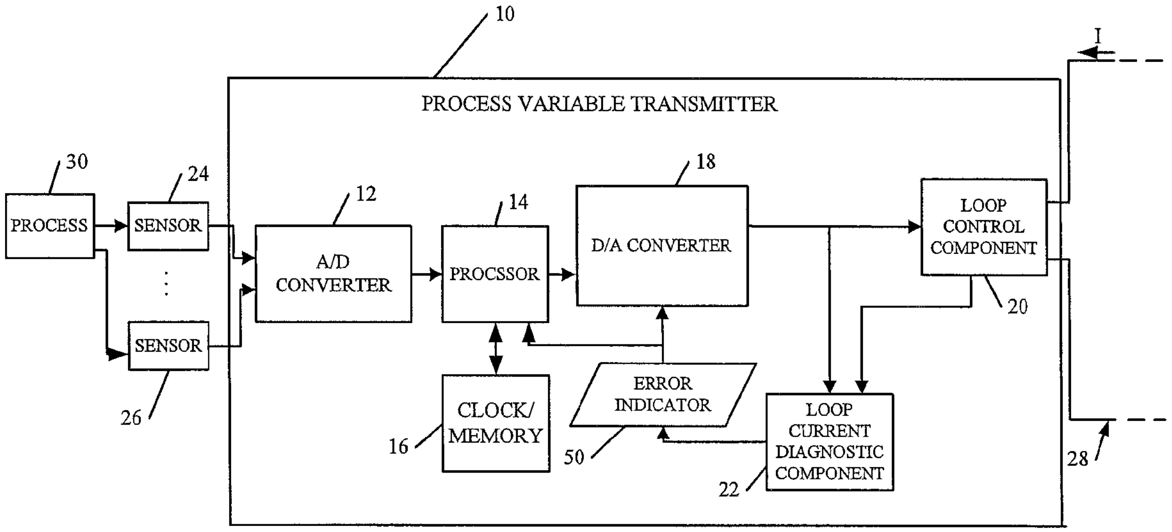
FIG. 1 is a simplified block diagram of a process variable transmitter coupled to a host system and sensors in a process.

FIG. 1 is a simplified block diagram of a transmitter 10 in accordance with one embodiment. Transmitter 10, in the embodiment shown in FIG. 1, includes analog-to-digital (A/D) converter 12, processor 14, clock and memory circuitry 16, digital-to-analog converter 18, loop control component 20 and loop current diagnostic component 22. Transmitter 10 is shown coupled to a plurality of different process variable (PV) sensors 24 and 26. Transmitter 10 may also illustratively be coupled to a host system or control room (not shown) over control loop 28. Transmitter 10 could be connected to a wireless communication link in addition to process control loop 28. In one embodiment, process control loop 28 provides power to transmitter 10 as well.

Sensors 24 and 26 are illustratively process variable sensors that receive inputs from process 30 that is being sensed. For example, sensor 24 may illustratively be a thermocouple that senses temperature and sensor 26 may be either the same or a different type of sensor, such as a flow sensor. Other PV sensors can include a variety of sensors, such as pressure sensors, pH sensors, etc. Sensors 24 and 26 illustratively provide an output that is indicative of a sensed process variable to A/D converter 12.

Conditioning logic can also be included (but is now shown) for amplifying, linearizing, and otherwise conditioning the signals provided by sensors 24 and 26. In any case, A/D converter 12 receives signals indicative of the process variables sensed by sensors 24 and 26. A/D converter 12 converts the analog signals into digital signals and provides them to processor 14.

In one embodiment, processor 14 is a computer microprocessor or microcontroller that has associated memory and clock circuitry 16 and provides digital information indicative of the sensed process variables to D/A converter 18. D/A converter 18 illustratively converts the signals indicative of process variables into analog signals that are provided to loop control component 20, in order to control the current (I) on loop 28. Loop control component 20 can provide the information over control loop 28 either in digital format (such as by using the HART protocol), or in analog format (or both) by controlling current (I) through loop 28. In any case, the information related to the sensed process variables is provided over process control loop 28 by transmitter 10.

In one embodiment, D/A converter 18 also provides an input to loop current diagnostic component 22. Signals output by D/A converter 18 are indicative of a desired loop current (I). That is, the signal output by D/A converter 18 is illustratively indicative of a loop current (I) which will reflect the value of the sensed process variable. Based on the signal provided by D/A converter 18, loop control component 20 illustratively controls loop 28 such that current (I) indicates the signal output by D/A converter 18.

It can be helpful to determine whether loop control component 20 is controlling the loop current (I) on loop 28 accurately, especially where an error in the loop current is an on-scale error. In other words, in a 4-20 milliamp process control loop, the loop current varies, on-scale, between 4 and 20 milliamps (that is, it varies, between an on-scale minimum value and an on-scale maximum value of 4 and 20 milliamps, respectively). However, under some conditions (such as when the instrument's operating current exceeds available current) on-scale errors (incorrect readings between 4 and 20 milliamps) can occur. For instance, if the current on loop 28 is supposed to be set at 10.0 milliamps, but it is really regulating to 12.2 milliamps, it can be helpful to detect this type of on-scale error. This type of error can occur, by way of example only, when excessive current is drawn by an integrated circuit on the circuit board of process variable transmitter 10 or because of circuit board current leakage. Of course, these are examples only, and on-scale errors can occur for other reasons as well.

Figure 2:
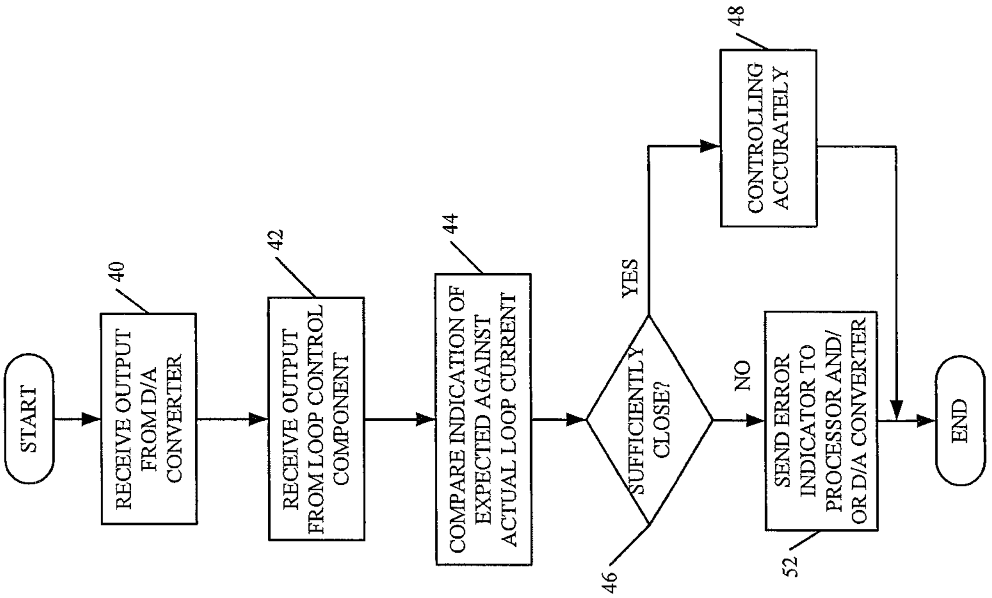
FIG. 2 is a flow diagram illustrating one embodiment of the operation of a loop current diagnostic component shown in FIG. 1.

Therefore, FIG. 1 shows that transmitter 10 also includes loop current diagnostic component 22. In the embodiment shown in FIG. 1, the output of D/A converter 18 is provided to diagnostic component 22, as is an indication from loop control component 20 that indicates the level of the actual loop current flowing on loop 28. FIG. 2 is a flow diagram illustrating how loop current diagnostic component 22 operates, in accordance with one embodiment, to identify on-scale errors in control loop 28.

Diagnostic component 22 first receives the output from D/A converter 18. This is indicated by block 40 in FIG. 2. Diagnostic component 22 also receives the output from loop control component 20. This is indicated by block 42 in FIG. 2. The signal output from D/A converter 18 and that output from loop control component 20 are indicative of the desired and actual loop current values, respectively. Thus, loop current diagnostic component 22 compares the expected (or desired) and actual loop current values as illustrated by block 44 in FIG. 2. If the two values are sufficiently close, then loop current control component 20 is accurately controlling the current on loop 28 based on the output of D/A converter 18. This is indicated by blocks 46 and 48 in FIG. 2.

However, at block 46, it is determined that the two signals are not sufficiently close, then loop current diagnostic component 22 generates and sends an error indicator 50 to processor 14 and/or D/A converter 18, asserting an alarm condition. This is indicated by block 52 in FIG. 2.

In order to determine whether the actual and expected loop currents are sufficiently close, current diagnostic component 22 illustratively compares the two signals to determine whether they are within a predetermined threshold value of one another. If so, then they are sufficiently close. Otherwise, they are not close enough and the error indicator 50 is generated. The particular threshold value can be set empirically, or in another way, and may vary based on the application, based on the particular control loop being used, or based on other factors. In one embodiment, it may be set to 100 microamps.

Figure 3:
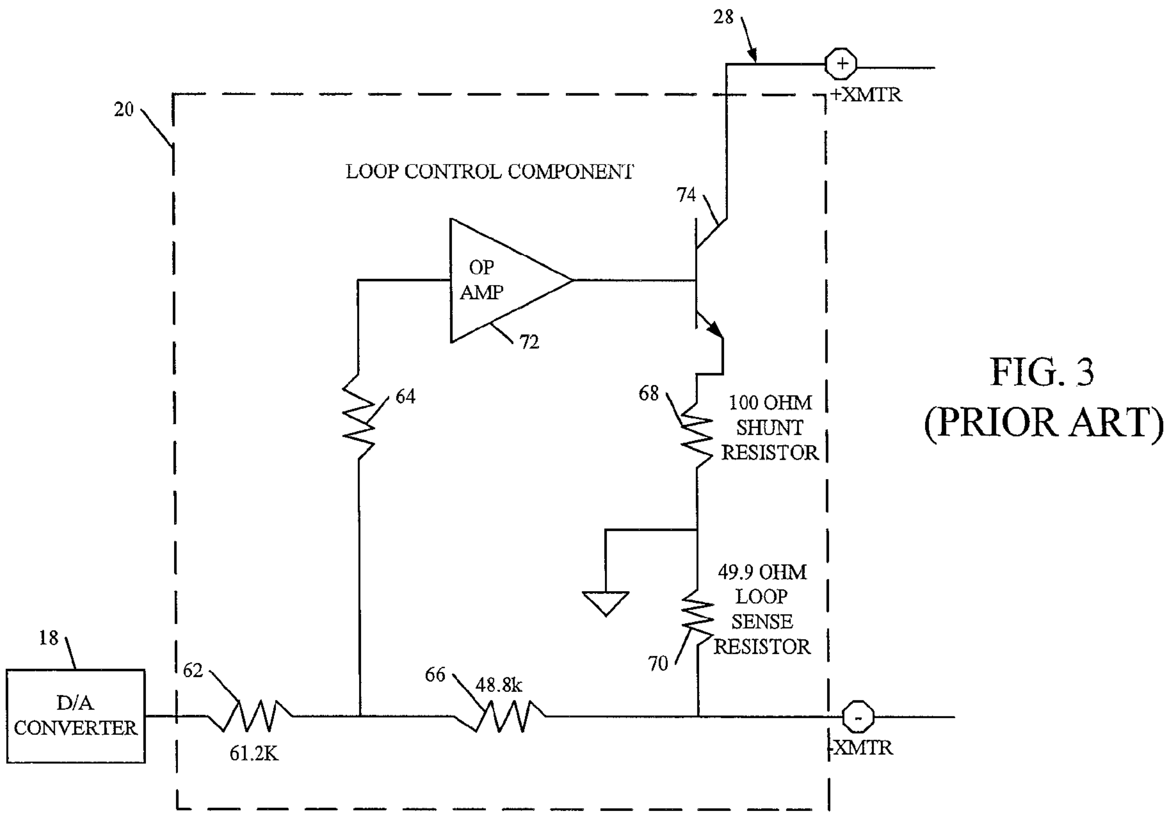
FIG. 3 (PRIOR ART)
FIG. 3 is a schematic diagram illustrating one embodiment of a loop current control component.

In order to describe loop current diagnostic component 22 in greater detail, an understanding of a conventional loop control component may be helpful. FIG. 3 illustrates a partial block diagram and partial schematic diagram showing a conventional loop control component 20. It can be seen that loop control component 60 includes resistors 62, 64, 66, 68, and 70, operational amplifier 72, and transistor 74.

Figure 4:
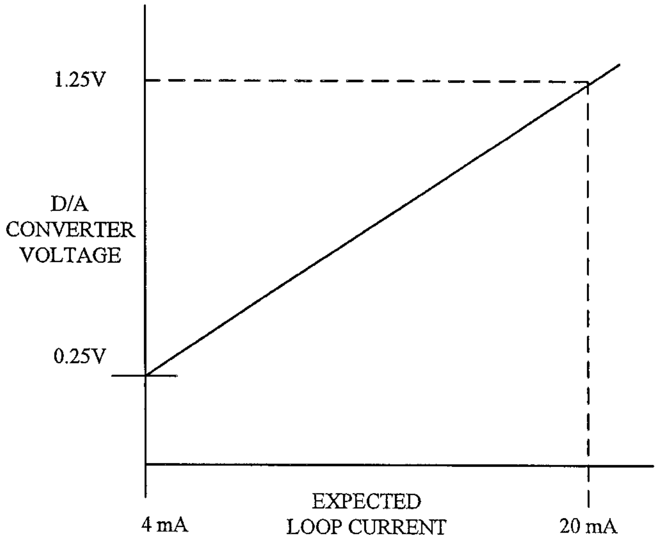
FIG. 4 is a graph showing one embodiment of loop current plotted against digital-to-analog converter voltage.

In accordance with one embodiment, D/A converter 18 provides an analog output voltage that varies linearly in proportion to the desired loop current on loop 28. By way of example, D/A converter 18 illustratively provides, at its output, 0.25 volts when the loop current on loop 28 is desired to be 4 milliamps, and 1.25 volts when the loop current on loop 28 is desired to be 20 milliamps. FIG. 4 illustrates this graphically. It can be seen from FIG. 4 that as the expected loop current varies between 4 milliamps and 20 milliamps, the output voltage from D/A converter 18 varies linearly, between 0.25 volts and 1.25 volts.

Figure 5:
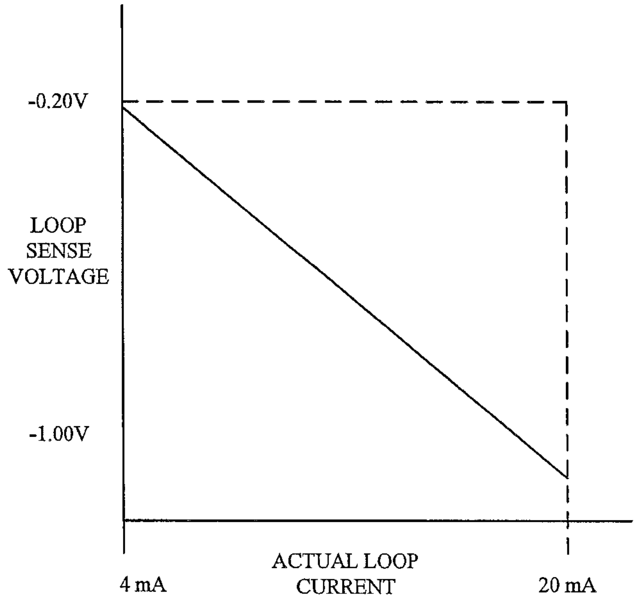
FIG. 5 is a graph of one embodiment showing loop current plotted against loop sense voltage.

In order to regulate the loop current to the value set by the output voltage from D/A converter 18, loop control component 20 illustratively controls the loop current by measuring the voltage across a precision resistor 70, which may illustratively be 49.9 ohms. It can be seen from FIG. 3 that the voltage developed across resistor 70 is negative with respect to circuit ground. It can also be seen that, based on the values of resistors 62, 66, 68 and 70, voltage across precision resistor 70 will illustratively vary, linearly, between −0.20 volts and −1.00 volts. FIG. 5 shows this graphically. It can be seen from FIG. 5 that as the loop voltage across precision resistor 70 varies between −0.20 volts and −1.00 volts, the actual loop current flowing on loop 28 varies between 4 milliamps and 20 milliamps.

Figure 6:
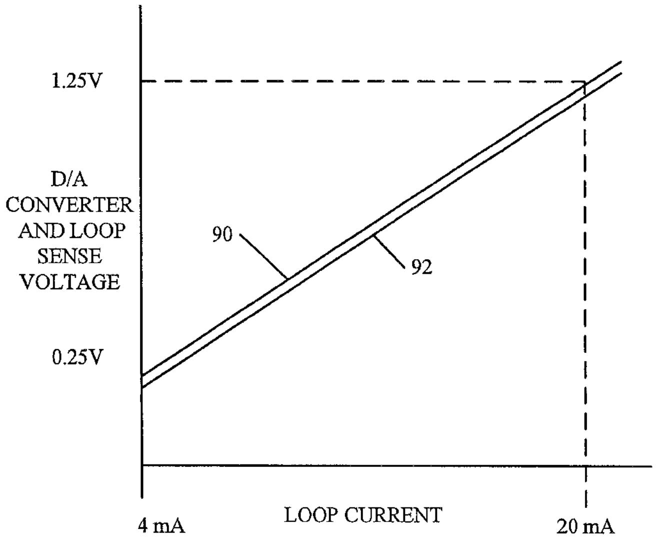
FIG. 6 is a graph showing one illustrative embodiment of loop current plotted against both digital-to-analog converter voltage and inverted and scaled loop sense voltage.

From graphs 4 and 5, it can be seen that by inverting and scaling either the voltage output by D/A converter 18 (shown in FIG. 4) or the loop voltage across resistor 70 (shown in FIG. 5) the two are very similar. For instance, FIG. 6 shows a graph of both the voltage output by D/A converter 18 and the loop voltage across resistor 70 when the loop voltage shown in FIG. 5 has been inverted and multiplied by a scale factor of 1.25. Because the voltage output by D/A converter 18 (shown by numeral 90 in FIG. 6) represents the desired or expected loop current, and because the loop voltage across resistor 70 (indicated by 92 in FIG. 6) represents the actual loop current, on-scale errors can be identified by simply comparing the two values shown in FIG. 6. This, effectively, compares desired or expected loop current against actual loop current.

Figure 7:
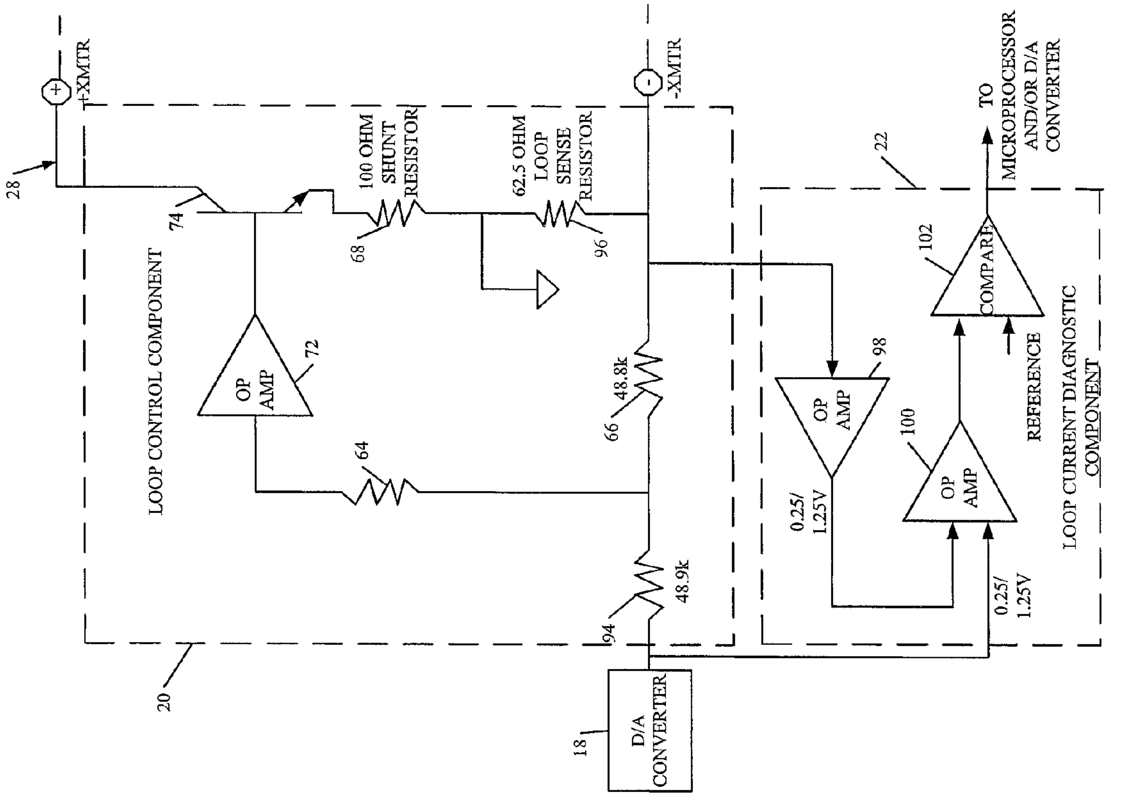
FIG. 7 is a partial block diagram, partial schematic diagram of another embodiment of a loop control component.

FIG. 7 illustrates one embodiment of loop control component 20 and loop current diagnostic component 22 for performing this type of comparison. It will be noted, of course, that the embodiment shown in FIG. 7 is only one illustrative embodiment and a wide variety of other circuits could be used to compare the two values as well. However, the embodiment shown in FIG. 7 is one relatively inexpensive and accurate way for comparing the two values and providing a signal to processor 14 and/or D/A converter 18 that indicates when an error has occurred.

It can be seen in FIG. 7 that loop control component 20 includes some elements which are similar to those shown in FIG. 3, and similar elements are similarly numbered. It can also be seen that resistors 62 and 70 have been replaced by resistors 94 and 96. The values of resistors 94 and 96 have been chosen to scale the voltage developed across resistor 96 by the loop current flowing on loop 28 by a factor of 1.25 (or by any other factor to make it substantially equal in magnitude to the voltage output by D/A converter 18).

Loop current diagnostic component 22 illustratively includes operational amplifiers 98, 100 and 102. Operational amplifier 98 is configured as an inverter such that the voltage developed across resistor 96 is inverted relative to circuit ground to have the same polarity as the voltage output by D/A converter 18. It can be seen that, in the embodiment shown in FIG. 7, the (now scaled) on-scale voltage across resistor 96 will vary from −0.25 volts to −1.25 volts. Therefore, the output of operational amplifier 98 varies from 0.25 volts to 1.25 volts.

Operational amplifier 100 is connected as a differential operational amplifier. It therefore compares the voltage output by D/A converter 18 (which also varies on-scale from 0.25 volts to 1.25 volts) to the output of operational amplifier 98. The two values should be substantially the same. If they are not, then loop control component 20 is not accurately controlling the loop current on loop 28 to reflect the output of D/A converter 18. However, because the two signals received by operational amplifier 100 may not be identical, but may still be sufficiently close to one another, comparator 102 is also provided. Comparator 102 compares the output of operational amplifier 100 (which reflects the difference between its two input signals) to a reference or threshold value. The output of comparator 102 will thus provide the error indicator 50 to processor 14 and/or D/A converter 18 only if the difference between the two signals provided at the input of operational amplifier 100 differ by a magnitude that is greater than the reference value input to operational amplifier 102.

Figure 8:
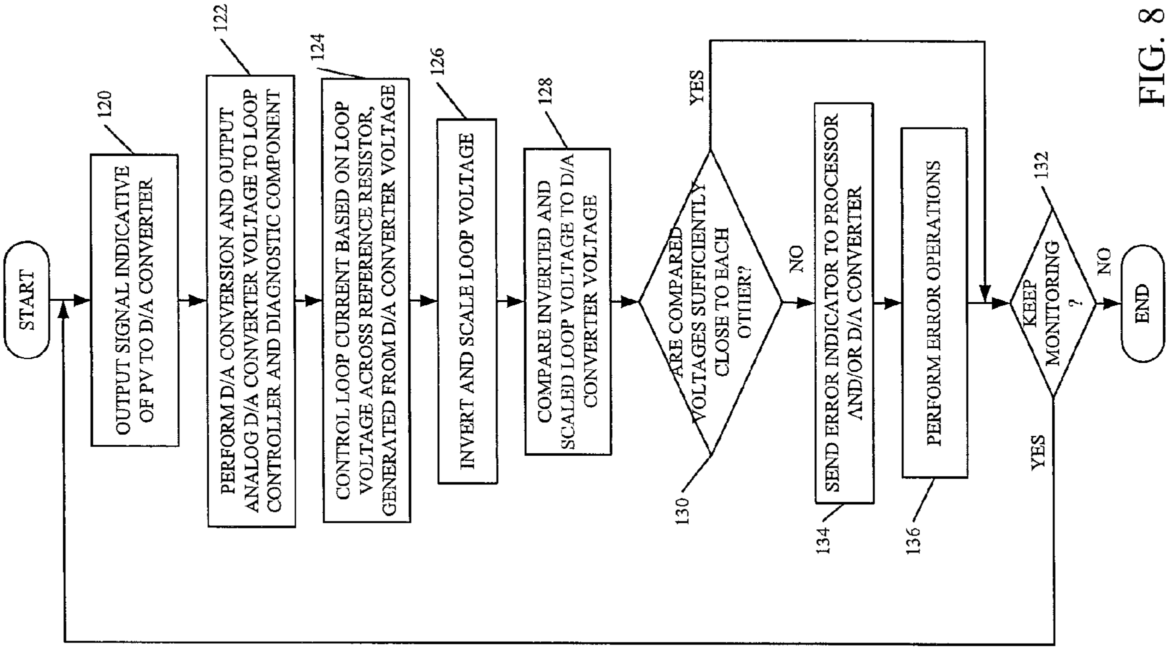
FIG. 8 is a flow diagram illustrating one embodiment of the operation the system shown in FIGS. 1 and 7.

FIG. 8 is a flow diagram illustrating the operation of the system shown in FIGS. 1 and 7 in accordance with one embodiment. FIG. 8 starts with processor 14 outputting the signal indicative of the process variable to D/A converter 18. This is indicated by block 120 in FIG. 8. D/A converter 18 then performs a digital-to-analog conversion and outputs an analog D/A converter voltage to loop control component 20 and to diagnostic component 22. This is indicated by block 122 in FIG. 8.

The loop control component 20 then controls the loop current on loop 28 based on the voltage developed across resistor 96. This is indicated by block 124 in FIG. 8. Loop control component 20 also, by virtue of the resistor values, scales the loop voltage across resistor 96 and provides it to loop current diagnostic component 22. Loop current diagnostic component 22 inverts the scaled voltage and compares it to the voltage output by D/A converter 18. This is indicated by blocks 126 and 128 in FIG. 8. Loop current diagnostic component 22 then determines whether the compared voltages are sufficiently close (using operational amplifier 100 and comparator 102). This is indicated by block 130 in FIG. 8. If the two are sufficiently close, then the system simply keeps monitoring the output of D/A converter 18 and the loop current on loop 28. This is indicated by block 132.

However, if, at block 130, it is determined that the two compared voltages are not sufficiently close to one another, then loop current diagnostic component 22 sends the error indicator 50 to processor 14 and/or D/A converter 18. This is indicated by block 134 in FIG. 8. Processor 14 can then perform any number of error operations, as indicated by block 136. For instance, processor 14 can perform numerous tasks, such as resetting D/A converter 18 to verify that the error is actually occurring. Processor 14 can also assert an alarm or perform additional diagnostics. Processor 14 can also perform any other desired operations in response to receiving the error indicator 50 from loop current diagnostic component 22.

It will be appreciated that, while the disclosure has referred to illustrative embodiments, a variety of changes can be made. For example, the functions performed by loop current diagnostic component 22 and loop control component 20 can all be performed by a single component, or the functions can be allocated between those components (or among other components in transmitter 10) in different ways. Similarly, while values have been given for certain resistors, voltages and currents, other values can be used as well. Those, given are exemplary only. In addition, while certain components (op amps, resistive elements, resistor, etc. . . . ) are identified in FIG. 7, they are identified by way of example only. The same function of scaling and inverting either the loop or D/A converter voltage and comparing the two can be accomplished in many different ways, with different circuits, other than that shown in FIG. 7.

In addition, while the above description has given a number of examples for process variables that can be sensed, it will of course be appreciated that a wide variety of other process variables can be sensed and processed in substantially the same way. Examples of such other process variables include pressure, level, flow or flow rate, etc. Further, while the embodiment discussed herein is given in the context of a two-wire transmitter, the present disclosure can be just as easily applied to a four-wire transmitter or any other type of transmitter as well.

Although the present disclosure has been described with reference to illustrative embodiments, workers skilled in the art will recognize that changes may be made in form and detail without departing from the spirit and scope of the disclosure.

What is claimed is:

1. A process variable transmitter, comprising:

a processor receiving an input signal indicative of a sensed process variable and outputting a digital signal indicative of the input signal;

a digital-to-analog (D/A) converter receiving the digital signal and converting it to an analog signal;

a loop control component receiving the analog signal and controlling a two-wire process control loop based upon a voltage generated across a resistive element coupled in series with the two-wire process control loop to provide a transmitter output signal indicative of the analog signal, the transmitter output signal varying, on-scale, between a first signal level and a second signal level; and a loop diagnostic component including an analog comparator which compares a first signal value indicative of the analog signal from the D/A converter with a second signal value indicative of the transmitter output signal to determine whether the transmitter output signal includes an on-scale error and responsively outputting an error indicator to the processor;

wherein the second value is generated as a function of the voltage across the resistive element.

2. The process variable transmitter of claim 1 wherein the loop control component regulates current on the two-wire process control loop, as the transmitter output signal, based on the voltage across the resistive element.

3. The process variable transmitter of claim 2 wherein the analog signal output by the D/A converter comprises an analog voltage and wherein the analog comparator compares that analog voltage, as the first signal value with the voltage across the resistive element, as the second signal value.

4. The process variable transmitter of claim 3 wherein the loop control component includes at least one additional resistive element, wherein the resistive element and the at least one additional resistive element have values that scale either the voltage across the resistive element or the analog voltage output by the D/A converter so that, when the current on the two-wire process control loop accurately indicates the analog signal output by the D/A converter, the voltage across the resistive element has a magnitude substantially equal to a magnitude of the analog voltage output by the D/A converter.

5. The process variable transmitter of claim 4 wherein the loop diagnostic component includes an inverter that inverts one of the voltage across the resistive element and the analog voltage output by the D/A converter such that as the analog voltage output by the D/A converter varies from a scale maximum value to a scale minimum value, the voltage across the resistive element, when it is accurately reflecting the analog voltage output by the D/A converter, varies to have a same value as the analog voltage output by the D/A converter.

6. The process variable transmitter of claim 1 wherein the loop diagnostic component compares the first signal value and the second signal value to determine whether a difference between them is within an analog threshold value, and if not, outputs the error indicator.

7. The process variable transmitter of claim 1 wherein the processor performs additional diagnostics in response to receiving the error indicator.

8. The process variable transmitter of claim 1 wherein the processor performs a verification operation to verify an error has occurred in response to receiving the error indicator.

9. The process variable transmitter of claim 1 wherein the processor asserts an alarm in response to receiving the error indicator.

10. The process variable transmitter of claim 1 wherein the two-wire process control loop varies, on-scale, between 4 milliamps, as the first signal level, and 20 milliamps, as the second signal level.

11. A method of identifying errors output by a process variable transmitter, comprising:

generating a digital signal related to the sensed process variable;

sensing a process variable using a process variable sensor;

generating an analog signal related to the sensed process variable using a digital-to-analog (D/A) converter;

controlling a two-wire process control loop to carry a transmitter analog output signal indicative of an analog signal from the D/A converter based upon a voltage generated across a resistive element coupled in series with the two-wire process control loop, the analog output signal varying, on-scale, between a scale maximum value and a scale minimum value;

comparing, in the process variable transmitter using an analog comparator, a first signal value indicative of the transmitter analog output signal with a second signal level indicative of the analog signal from the D/A converter to detect on-scale errors in the analog output signal;

wherein the second value is generated as a function of the voltage across the resistive element.

12. The method of claim 11 and further comprising:

processing at least one of the analog signal and the transmitter analog output signal so that the first and second signal values are substantially the same, when the transmitter analog output signal is accurately indicative of the analog input signal.

13. The method of claim 12 wherein processing comprises inverting, on the process variable transmitter, at least one of the transmitter analog signal and the transmitter analog output signal.

14. The method of claim 13 wherein the two-wire process control loop comprises a 4-20 milliamp control loop that carries a current that varies, on scale, between 4 and 20 milliamps, and wherein controlling the communication loop comprises:

receiving, as the analog signal, an analog voltage output by the digital-to-analog (D/A) converter indicative of the sensor signal; and controlling the current based on the analog voltage output by the D/A converter and based on a voltage across a resistive element in the control loop.

15. The method of claim 14 wherein the analog voltage output by the D/A converter and the analog voltage across the resistive element in the control loop are scaled so, when operating correctly, they have substantially a same magnitude.

16. The method of claim 15 wherein one of the analog voltage output by the D/A converter and the analog voltage across the resistive element in the control loop are inverted, on the process variable transmitter, so, when operating correctly, they have a same value, within an analog threshold difference.

17. A process variable transmitter, comprising:

a processor that outputs a digital sensor signal indicative of a value of a sensor input signal;

a digital-to-analog (D/A) converter that receives the digital sensor signal and provides an analog sensor voltage indicative of the digital sensor signal;

a loop control component that controls current on a two-wire process control loop to vary, on-scale, between a scale maximum current and a scale minimum current, based on the analog sensor voltage, the loop control component regulating the current on the two-wire process control loop based on a regulation voltage across a resistive element in the two-wire process control loop; and an analog circuit that scales and inverts at least one of the regulation voltage and the analog sensor voltage so, when operating correctly, they have substantially a same amplitude, and including an analog comparator that compares the regulation voltage and the analog sensor voltage and outputs an error indicator if they differ by more than a threshold amount.

18. The process variable transmitter of claim 17 wherein the two-wire process control loop comprises a 4-20 milliamp control loop.

* * * * *